US009568500B2

United States Patent
Hirakawa et al.

(10) Patent No.: US 9,568,500 B2
(45) Date of Patent: *Feb. 14, 2017

(54) ELECTRICAL TEST PROBE

(71) Applicant: Kabushiki Kaisha Nihon Micronics, Tokyo (JP)

(72) Inventors: Hideki Hirakawa, Aomori (JP); Yuko Kanazawa, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 271 days.

This patent is subject to a terminal disclaimer.

(21) Appl. No.: 13/891,071

(22) Filed: May 9, 2013

(65) Prior Publication Data
US 2013/0321016 A1 Dec. 5, 2013

(30) Foreign Application Priority Data

May 29, 2012 (JP) .................................. 2012-121582

(51) Int. Cl.
*G01R 1/067* (2006.01)
(52) U.S. Cl.
CPC ....... *G01R 1/06794* (2013.01); *G01R 1/06727* (2013.01); *G01R 1/06755* (2013.01)
(58) Field of Classification Search
CPC ............ G01R 1/06794; G01R 1/06755; G01R 1/06727
USPC .................................................... 324/755.01
See application file for complete search history.

(56) References Cited

U.S. PATENT DOCUMENTS

| 7,471,096 | B2* | 12/2008 | Kohashi et al. ......... 324/754.09 |
| 7,586,321 | B2* | 9/2009 | Hirakawa et al. ....... 324/755.11 |
| 8,671,567 | B2* | 3/2014 | Hirakawa et al. .............. 29/885 |
| 2008/0074128 | A1* | 3/2008 | Hirakawa et al. ............. 324/754 |
| 2008/0186038 | A1 | 8/2008 | Hirakawa et al. |
| 2011/0115515 | A1 | 5/2011 | Hirakawa et al. |

FOREIGN PATENT DOCUMENTS

| JP | H07-29838 U | 6/1995 |
| JP | 2006284297 A | 10/2006 |
| JP | 2007271343 A | 10/2007 |
| JP | 2008089399 A | 4/2008 |
| KR | 100902019 B1 | 6/2009 |
| TW | 200841019 A | 10/2008 |
| TW | 201018917 A | 5/2010 |

OTHER PUBLICATIONS

Laughton, M.A., Electrical Engineers Reference Book, Elsevier, 1990, p. 1-4.*

* cited by examiner

*Primary Examiner* — Thomas Valone
(74) *Attorney, Agent, or Firm* — Lorenz & Kopf, LLP

(57) ABSTRACT

An electrical test probe according to an embodiment includes a probe main body portion having a connection end to a circuit of a probe base plate and made of a first metal material with resiliency, and a probe tip portion having a probe tip, made of a second metal material with higher hardness than that of the first metal material for the probe main body portion, and communicating with the probe main body portion, wherein the probe main body portion and the probe tip portion are provided with a current path made of an equal metal material extending from the probe tip to the connection end.

14 Claims, 7 Drawing Sheets

ELECTRICAL TEST PROBE

RELATED APPLICATION

This application claims the benefit of, and claims priority to, Japanese patent application number 2012-121582, filed on May 29, 2012.

TECHNICAL FIELD

The subject matter relates to a probe for use in an electrical test of a device under test and excellent in mechanical characteristics and electrical characteristics.

BACKGROUND

In general, multiple semiconductor integrated circuits formed on a semiconductor wafer undergo an electrical test before being separated into respective chips to determine whether or not they are manufactured in accordance with the specification. In this electrical test, a probe assembly such as a probe card provided with a plurality of probes to be connected to electrodes of devices under test that are the respective semiconductor integrated circuits, that is, an electrical connecting apparatus, is used. The devices under test are connected to a tester via this electrical connecting apparatus.

As one of conventional probes used for this electrical connecting apparatus of this kind, there is one including a plate-like probe main body portion or a probe main body portion and a probe tip portion provided on the probe main body portion to abut on an electrode of a device under test (for example, refer to Patent Literature 1 and 2). The probe main body portion has an attaching portion having a connection end to a probe base plate to which the probe is attached, an arm portion extending in a lateral direction from the attaching portion to be spaced from the probe base plate along the probe base plate, and a pedestal portion extending downward from a tip end of the arm portion, and the pedestal portion is provided with the probe tip portion. The probe of this kind is referred to as a so-to-speak cantilever-type probe.

In the probe described in Patent Literature 1, the probe main body portion is made of a conductive material with higher resiliency than a material used for the probe tip portion. On the other hand, the probe tip portion provided at a tip end of the pedestal portion of the probe main body portion is made of a conductive material more excellent in hardness than the material used for the probe main body portion.

By doing so, when a tip end (probe tip) of the probe tip portion of the probe is thrust to the electrode of the device under test, appropriate flexible deformation can be generated in the arm portion by elasticity of the arm portion. When the probe tip slides on the electrode along with the flexible deformation of this arm portion, an oxide film on the electrode is scraped away by the slide of the probe tip. Thus, the probe tip electrically contacts the electrode reliably. Also, since the probe tip portion including the probe tip is made of a metal material with higher hardness than the probe main body portion, abrasion by the slide of the probe tip is suppressed. Accordingly, the probe is provided with favorable electrical and mechanical characteristics.

Meanwhile, when the probe size is reduced along with a trend of a fine pitch in the electrodes of the device under test, an allowable current amount that can flow in the probe is decreased. By maintaining current flowing in the probe within the allowable current amount, appropriate electrical contact can be achieved between the probe and the electrode in a state where appropriate probe pressure is applied to the probe tip of the probe by the elasticity of the probe. However, when overcurrent exceeding the allowable current flows in the probe, a temperature of the probe increases, and loss is generated in the elasticity of the probe by this temperature increase, which may cause the probe to be damaged.

CITATION LIST

Patent Literature 1: Japanese National Patent Appln. Public Disclosure No. 2008-190885
Patent Literature 2: Japanese National Patent Appln. Public Disclosure No. 2011-107023

SUMMARY

An electrical probe enabling to restrict a temperature increase caused by electricity distribution and excellent in mechanical characteristics and electrical characteristics is provided.

The subject manner is based on the following findings. For the purpose of increasing an allowable current amount, as for the aforementioned conventional probe, the present inventors selected first metal materials constituting the probe main body portions and second metal materials constituting the probe tip portions in various manners, conducted experiments on respective probes made of combination of these materials to derive changes of a probe pressure keeping ratio relative to changes of an electrical current value, and obtained a characteristic graph as illustrated in FIG. 1. A horizontal axis represents a current value (mA) flowing in each probe. A vertical axis represents a probe pressure keeping ratio (%) expressing loss of elasticity of the probe at this time, and the probe pressure keeping ratio is a ratio of obtained probe pressure to predetermined probe pressure.

Here, how to derive the probe pressure keeping ratio (%) is described. In a state where a cantilever-type probe targeted for probe pressure measurement is attached to an evaluation circuit board, a gold (Au) plate is brought into contact with a probe tip of the probe. After the contact, the gold plate is further moved as much as a distance of 100 μm toward the probe tip so as to be thrust to the probe tip of the probe. In this 100-μm OD (overdriving) state, probe pressure at this time is measured with a current value flowing from the circuit board via the probe in the gold plate as a parameter. Probe pressure when the current value is 0 mA is regarded as 100%, and a current value enabling to keep 90% probe pressure thereof is referred to as an allowable current value.

For example, in a case where the probe pressure at 0 mA with no current flow is 30.0 mN in the aforementioned OD state, this probe pressure value is regarded as 100%. The probe pressure keeping ratio is 91% (27.5 mN/30.0 mN×100%) in a case where the probe pressure when 600 mA current flows is 27.5 mN, and similarly, the probe pressure keeping ratio is 80% in a case where the probe pressure when 850 mA current flows is 24.0 mN.

A characteristic line A illustrated in the graph in FIG. 1 represents a characteristic of a probe in which both the first metal material constituting the probe main body portion and the second metal material constituting the probe tip portion are made of NiB (nickel boron). A characteristic line B represents a characteristic of a probe in which the probe main body portion (first metal material) is made of NiB while the probe tip portion (second metal material) is made of an 80% Pd-20% Ni alloy. Also, a characteristic line C represents a characteristic of a probe in which the probe main body portion (first metal material) is made of NiB while the probe tip portion (second metal material) is made of Rh (rhodium).

According to the graph in FIG. 1, when a current amount enabling to keep a 90% probe pressure keeping ratio is regarded as an allowable current value as described above, an allowable current value of 923 mA was obtained for the characteristic line A. On the other hand, an allowable current value of about 800 mA was obtained for the characteristic line B, and an allowable current value of 687 mA was obtained for the characteristic line C. As a result of a comprehensive consideration of these results and a measurement result of an allowable current value of a probe in which plating is applied entirely to cover the probe tip portion and the probe main body portion of the conventional probe, the present inventors have obtained a finding in which electrical resistance at an interface by foreign metal materials of the first metal material constituting the probe main body portion and the second metal material constituting the probe tip portion is a main cause for heat generation that brings about loss of elasticity of the probe.

Based on this finding, an electrical test probe according to an embodiment includes a probe main body portion having a connection end to a circuit of a probe base plate and made of a first metal material with resiliency, and a probe tip portion having a probe tip, made of a second metal material with higher hardness than that of the first metal material for the probe main body portion, and communicating with the probe main body portion, wherein the probe main body portion and the probe tip portion are provided with a current path made of an equal metal material extending from the probe tip to the connection end.

In the electrical test probe according to the embodiment, appropriate elasticity of the probe main body portion made of the first metal material with resiliency enables the probe tip portion to hold appropriate probe pressure. Also, since the current path made of the equal metal material extending from the probe tip to the connection end functions as a bypass path on the electrical path having an interface between the probe main body portion and the probe tip portion, and the bypass path does not have an interface formed by a junction of foreign metals on the path, electrical resistance of the probe is decreased. As a result, the probe achieves improvement of electrical characteristics including an increase of an allowable current amount without impairing mechanical characteristics thereof.

The equal metal material can be either the first or second metal material.

The equal metal material can be the second metal material among the first and second metal materials. For the second metal material, a metal material having lower electrical resistivity ($\Omega$ cm) than the first metal material can be used. In this case, by covering the probe main body portion made of the first metal material with the second metal material with higher hardness than that of the first metal material, a part of the second metal material covering the main body portion can function as a protective layer of the main body portion.

Nickel or a nickel alloy can be used as the first metal material, and rhodium can be used as the second metal material.

For the equal metal material, a metal material having lower electrical resistivity ($\Omega$ cm) than the first or second metal material is preferably used from a viewpoint of decreasing electrical resistance of the probe.

The probe can be a cantilever-type probe in which the probe main body portion includes an attaching portion extending in a direction away from the connection end to the circuit of the probe base plate, an arm portion extending approximately perpendicularly to an extending direction of the attaching portion, and a pedestal portion extending in an equal direction to the extending direction of the attaching portion, and in which the probe tip portion is protruded from an extending end of the pedestal portion.

The probe can be a vertical probe in which the probe main body portion extends in a rod shape in a direction away from the connection end to the circuit of the probe base plate, and in which the probe tip portion extends from a tip end of the probe main body portion approximately in an equal direction to that of the probe main body portion.

With the embodiment, as described above, since it is possible to achieve improvement of electrical characteristics including an increase of an allowable current amount without impairing mechanical characteristics, it is possible to provide a probe excellent in durability without generating loss of elasticity or melting of the probe tip by overcurrent heat even under a fine pitch condition.

DETAILED DESCRIPTION

Figure 2:
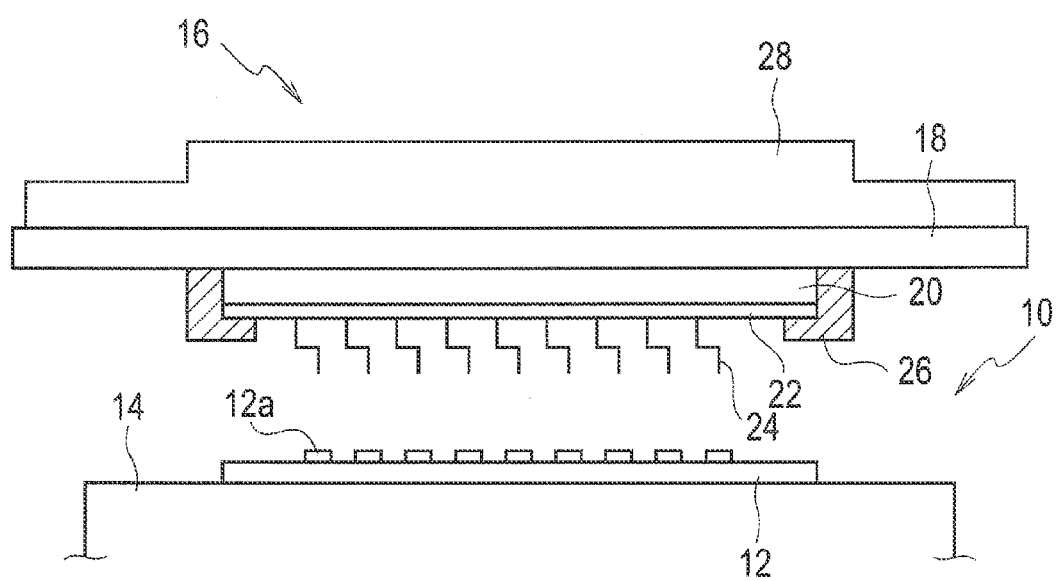
FIG. 2 is a front view illustrating an example of an electrical connecting apparatus in which a probe according to an embodiment has been incorporated by breaking a part thereof.

A testing system 10 according to an embodiment is used in an electrical test of multiple flat plate-like integrated circuits formed on a semiconductor wafer 12 as illustrated in FIG. 2, for example. These multiple integrated circuits formed on the semiconductor wafer 12 undergo the electrical test at a time or in several batches. On an upper surface of the semiconductor wafer 12 as a device under test, multiple electrodes 12a for the respective integrated circuits are provided.

The testing system 10 includes a chuck top 14 removably holding the device under test 12 with the electrodes 12a of the device under test 12 facing upward and an electrical connecting apparatus 16 electrically connecting the electrodes 12a for the respective integrated circuits provided on the device under test 12 on the chuck top to an electrical circuit for the test (not illustrated).

The electrical connecting apparatus 16 includes a printed wiring base plate 18 and a probe base plate 22 piled on the printed wiring base plate via a ceramic base plate 20. To one surface of the probe base plate 22 are attached to be arrayed multiple probes 24 according to an embodiment. The ceramic base plate 20 and the probe base plate 22 are attached to the printed wiring base plate 18 to be piled on a lower surface of the printed wiring base plate via a conventionally well-known attaching ring assembly 26 made of a dielectric material such as a ceramic so that the probes 24 attached to the probe base plate may face downward.

On an upper surface of the printed wiring base plate 18 is arranged a reinforcing member 28 made of a metal material and allowing partial exposure of the upper surface of the printed wiring base plate 18. The probe base plate 22, the ceramic base plate 20, the printed wiring base plate 18, the reinforcing member 28, and the attaching ring assembly 26 are combined integrally by a not illustrated combining member, such as a bolt, similar to a conventional one.

In the probe base plate 22 are formed conventionally well-known conductive paths although they are not illustrated, and the probes 24 are attached to the probe base plate 22 so as to be fixedly connected to the respective corresponding conductive paths. The respective conductive paths in the probe base plate 22 corresponding to the probes 24 are electrically connected to sockets (not illustrated) arranged in an area exposed from the reinforcing member 28 on the upper surface of the printed wiring base plate 18 via respective conductive paths (not illustrated) formed to respectively pass through the ceramic base plate 20 and the printed wiring base plate 18 and are connected to the not illustrated electrical circuit for the test via the sockets as is conventionally well known.

Accordingly, by moving the electrical connecting apparatus 16 and the vacuum chuck 14 to be closer to each other so that the respective probes 24 of the electrical connecting apparatus 16 may abut on the corresponding electrodes 12a of the semiconductor wafer 12 as a device under test, the electrodes 12a can be connected to the circuit for the test. From the circuit for the test, electrical signals (voltage and current) are supplied via the electrical connecting apparatus 16 and via the electrodes 12a corresponding to the respective integrated circuits, and response signals thereof are supplied from the device under test 12 via the corresponding electrodes 12a to the circuit for the test. By doing so, the electrical test of the device under test 12 can be performed.

Figure 3:
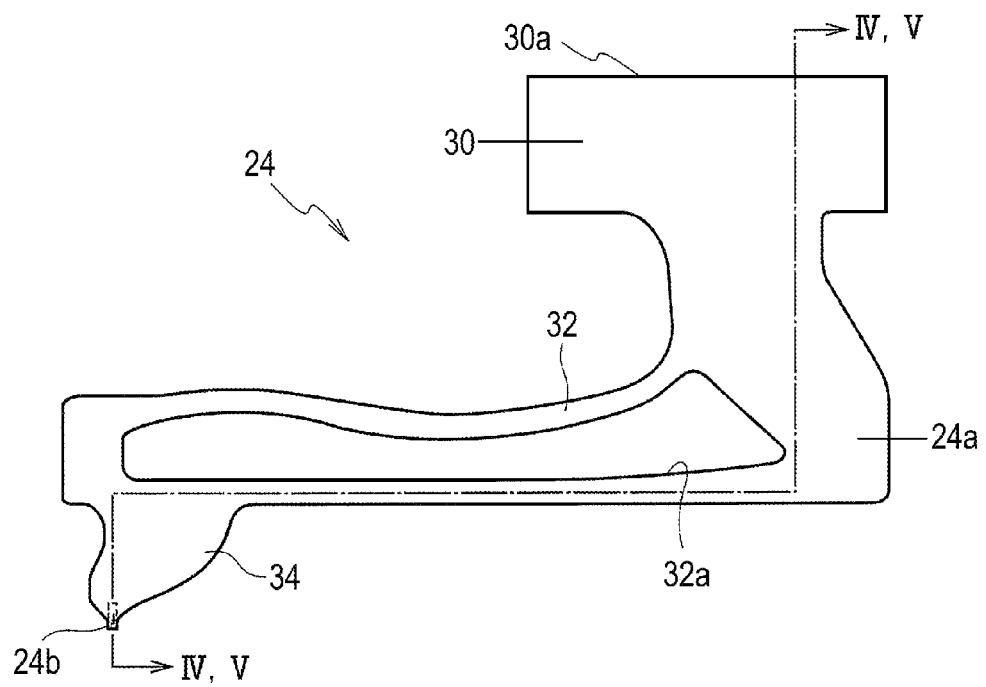
FIG. 3 is a side view of the probe used in the electrical connecting apparatus illustrated in FIG. 2.

Referring to FIG. 3, which is an enlarged view of each probe 24, each probe 24 includes a flat plate-like probe main body portion 24a made of a first metal material that is a nickel alloy such as nickel boron and a probe tip portion 24b made of a second hard metal material such as rhodium. Both the portions 24a and 24b show relatively favorable conductivity. The probe main body portion 24a made of the nickel alloy is higher in resiliency than the rhodium constituting the probe tip portion 24b while the rhodium is higher in hardness than the metal material constituting the probe main body portion 24a.

The probe main body portion 24a can be made of a highly resilient metal material excellent in resiliency such as, for example, a nickel alloy such as a nickel tungsten alloy and a nickel cobalt alloy, a nickel, phosphor bronze palladium or cobalt alloy, instead of the aforementioned metal material. Also, a base layer of the probe tip portion 24b can arbitrarily be made of a highly hard metal material other than rhodium.

In an example illustrated in FIG. 3, the probe main body portion 24a includes an attaching portion 30 having a flat upper end 30a as a connection end to the aforementioned corresponding conductive path in the probe base plate 22 and extending downward from the upper end approximately perpendicular to the upper end or in a direction away from the probe base plate 22, an arm portion 32 extending in a lateral direction in parallel with the probe base plate 22 from a side of a lower end portion of the attaching portion, and a pedestal portion 34 extending downward from an extending end of the arm portion. Also, in the illustrated example, the arm portion 32 is provided with a slot 32a adapted to facilitate elastic deformation of the arm portion.

In the pedestal portion 34 is buried the probe tip portion 24b partially protruded from a lower end surface 34a (refer to FIG. 4) thereof. In an example illustrated in FIG. 4, the probe tip portion 24b has a crank-like vertical cross-sectional shape including a middle portion 36a having a lower surface corresponding to the lower end surface 34a of the pedestal portion 34 and a pair of linear end portions 36b and 36c extending in directions mutually away from both ends of the middle portion.

The probe tip portion 24b is buried in the pedestal portion 34 so that one end portion 36b thereof may be protruded from the lower end surface 34a of the pedestal portion 34 while the other end portion 36c may extend in the pedestal portion 34 along one side surface of the pedestal portion. Thus, the probe tip portion 24b and the probe main body portion 24a combined with the probe tip portion form an electrical path reaching the upper end 30a of the probe main body portion 24a from a probe tip of the probe tip portion 24b.

At an interface between the pedestal portion 34 and the probe tip portion 24b buried in the pedestal portion, a metal layer 38a made of the aforementioned first metal material constituting the probe main body portion 24a lies except at an end surface of the other end portion 36c. The metal layer 38a reaches a tip end of the end portion 36b protruded from the lower end surface 34a of the pedestal portion 34, that is, the probe tip.

The metal layer 38a made of the first metal material extends in the pedestal portion 34 of the probe main body portion 24a made of the first metal material along the end portion 36b of the probe tip portion 24b from the probe tip of the probe tip portion 24b. Thus, the metal layer 38a and the probe main body portion 24a form a current bypass path made of the equal metal material on the electrical path formed by the probe tip portion 24b and the probe main body portion 24a combined with the probe tip portion.

Thus, the bypass path formed by the metal layer 38a and the probe main body portion 24a of the equal metal material does not have an interface by a junction of foreign metal materials on the path reaching the upper end 30a of the probe main body portion 24a as the connection end to the probe base plate 22 from the probe tip of the probe tip portion 24b. Consequently, electrical resistance from the probe tip of the probe tip portion 24b to the upper end 30a of the probe main body portion 24a is significantly decreased.

Figure 4:
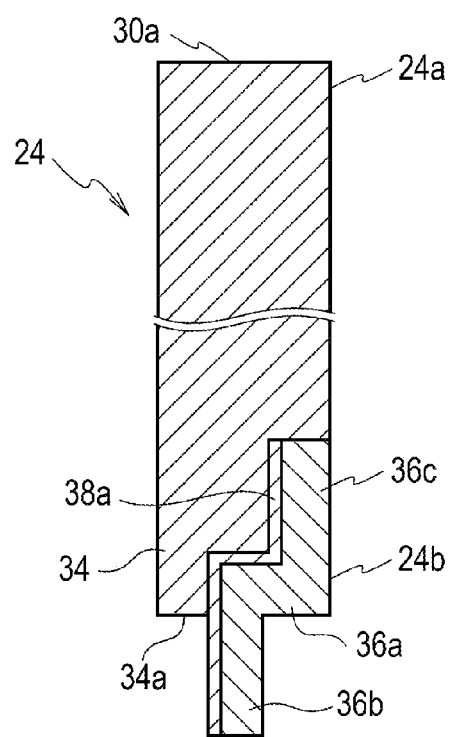
FIG. 4 is a cross-sectional view illustrating an example of the probe according to the embodiment obtained along a line IV-IV illustrated in FIG. 3.
Figure 5:
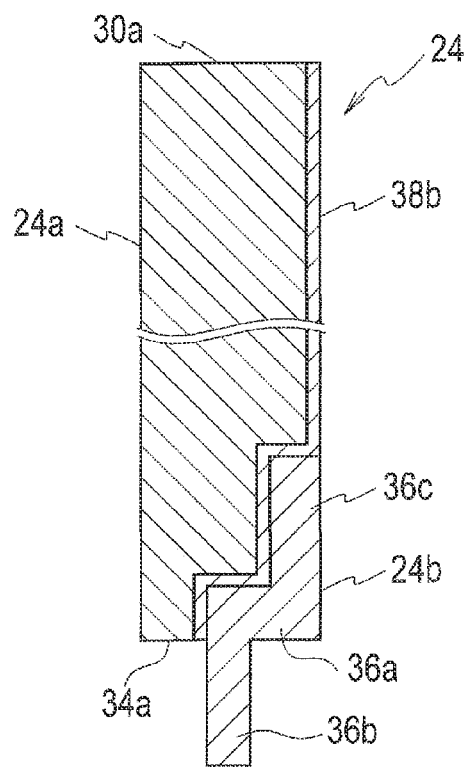
FIG. 5 is a cross-sectional view illustrating another example of the probe according to the embodiment obtained along a line V-V illustrated in FIG. 3.

FIG. 5 is a view similar to FIG. 4 illustrating another embodiment. In the example illustrated in FIG. 5, a metal layer 38b lying at an interface between the probe main body portion 24a and the probe tip portion 24b is made of the aforementioned second metal material constituting the probe tip portion 24b. The metal layer 38b made of this second metal material extends along the interface between the probe main body portion 24a and the probe tip portion 24b and is formed to cover an entire area of one side surface of the probe main body portion 24a so as to reach the upper end 30a of the probe main body portion 24a. Thus, the metal layer 38b forms a current bypass path made of the equal metal material on the electrical path formed by the probe tip portion 24b and the probe main body portion 24a combined with the probe tip portion, together with the probe tip portion 24b.

Since the bypass path formed by the metal layer 38b and the probe tip portion 24b is made of the equal metal material, the bypass path does not have an interface by a junction of foreign metal materials on the path reaching the upper end 30a of the probe main body portion 24a as the connection end to the probe base plate 22 from the probe tip of the probe tip portion 24b in a similar manner to that in the case of the metal layer 38a. Consequently, electrical resistance from the probe tip of the probe tip portion 24b to the upper end 30a of the probe main body portion 24a is significantly decreased in a similar manner to the example illustrated in FIG. 4.

Figure 1:
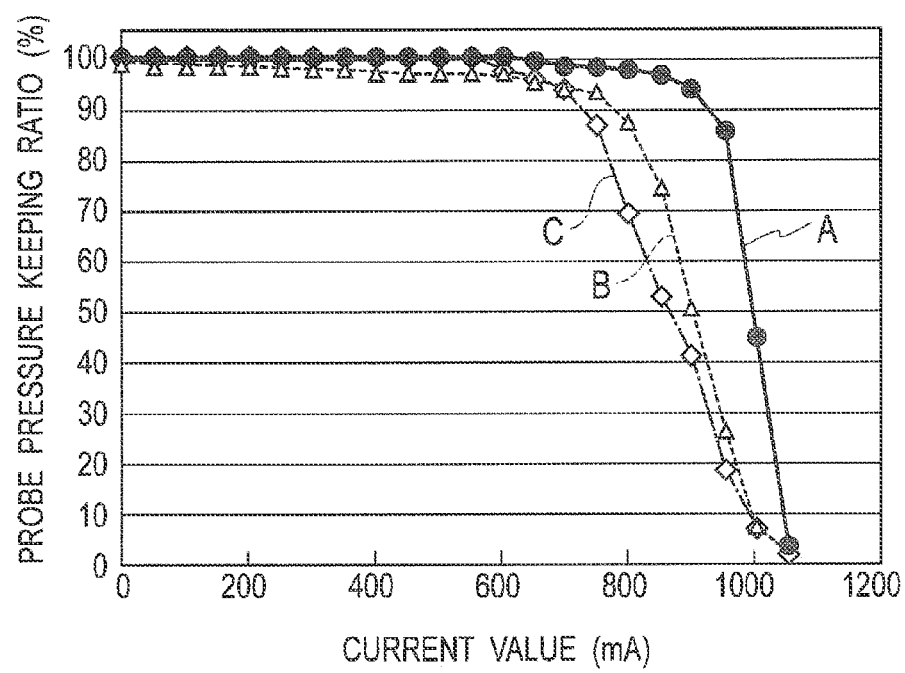
FIG. 1 is a characteristic graph illustrating changes of a probe pressure keeping ratio relative to changes of an electrical current value on each of various conventional electrical test probes.
Figure 6:
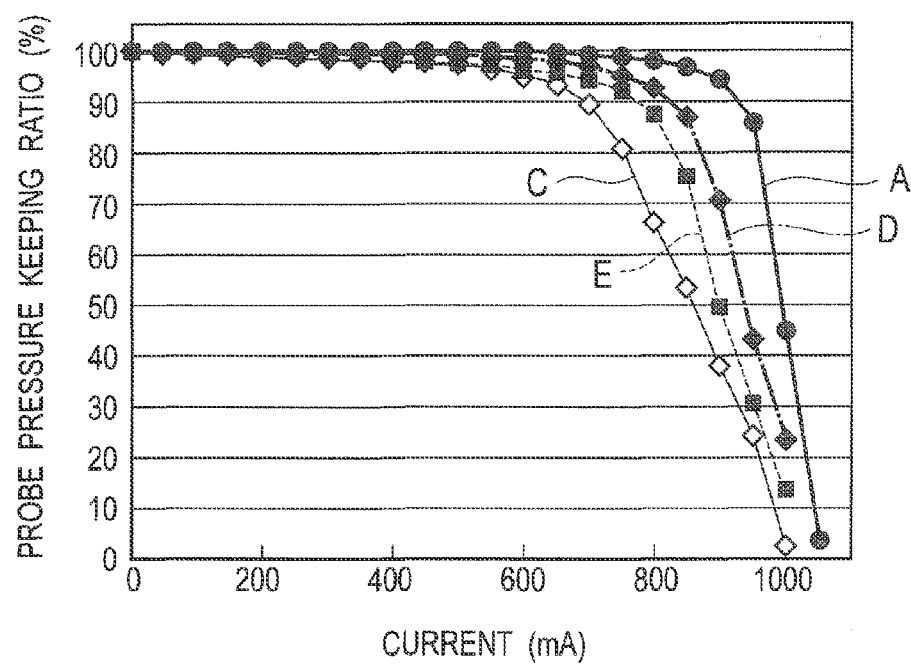
FIG. 6 is a graph similar to FIG. 1 illustrating comparison of characteristics between the probes according to the embodiment illustrated in FIGS. 4 and 5 and the conventional probes.

FIG. 6 is a graph similar to FIG. 1 illustrating comparison of characteristics between the probes 24 and 24 according to the embodiment illustrated in FIGS. 4 and 5 and the conventional probes. A probe pressure keeping ratio was measured in a similar method to the aforementioned one. Characteristic lines A and C are the characteristic lines A and C illustrated in FIG. 1, and the characteristic line A represents a characteristic of a probe in which both the first metal material constituting the probe main body portion and the second metal material constituting the probe tip portion are made of nickel boron. Also, the characteristic line C represents a characteristic of a probe in which the probe main body portion is made of nickel boron while the probe tip portion is made of rhodium. On the other hand, a characteristic line D represents a characteristic of the probe 24 illustrated in FIG. 4 or the probe 24 provided with the metal layer 38a while a characteristic line E represents a characteristic of the probe 24 illustrated in FIG. 5 or the probe 24 provided with the metal layer 38b.

For the characteristic lines A and C, allowable current values of 923 mA and 687 mA were obtained, respectively, as described above. On the other hand, an allowable current value of 818 mA was obtained for the characteristic line D of the probe 24 illustrated in FIG. 4, and an allowable current value of 770 mA was obtained for the characteristic line E of the probe 24 illustrated in FIG. 5.

As is apparent from the comparison among these allowable current values, the allowable current value for each probe 24 according to the embodiment was able to be larger at least by about 80 mA or more than the allowable current value for each conventional probe (characteristic line C), in which the probe main body portion and the probe tip portion have an interface by a junction of foreign metal materials and do not have a bypass path, although the allowable current value for each probe 24 according to the embodiment was inferior to that for the probe (characteristic line A), in which the probe main body portion and the probe tip portion are made of the equal metal material.

Next, methods for manufacturing the probes 24 will be described based on FIGS. 7A to 9H. First, a method for manufacturing the probe 24 illustrated in FIG. 4 will be described based on FIGS. 7A to 7E.

Figure 7A:
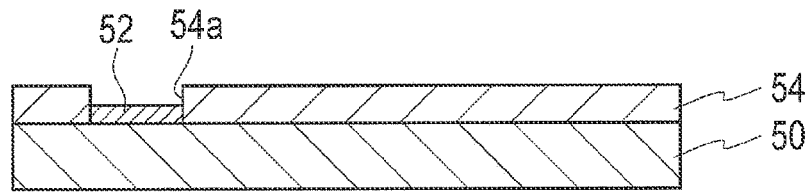
FIGS. 7A to 7E are process diagrams illustrating a process for manufacturing the probe according to the embodiment illustrated in FIGS. 3 and 4.

As illustrated in FIG. 7A, a photolithographic mask 54 for a sacrifice layer 52 that is to be removed afterward is formed on a base table 50 having a flat surface made of stainless steel by conventionally well-known selective exposure and development processing to a photoresist layer. A sacrifice layer material such as copper is deposited on a surface part of the base table 50 exposed from a recess 54a of the photolithographic mask 54 to have a predetermined thickness by an electroplating method, thus to form the sacrifice layer 52.

Figure 7B:
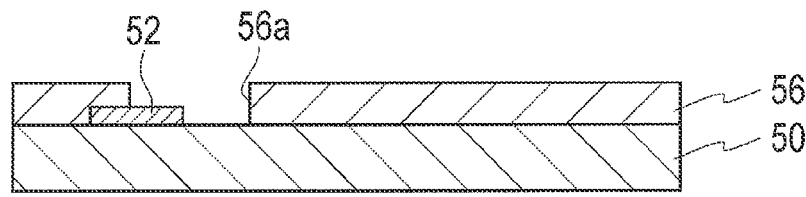

After removal of the photolithographic mask 54, a new second photolithographic mask 56 is formed to cover a surface part of the base table 50 and the sacrifice layer 52 as illustrated in FIG. 7B. The second photolithographic mask 56 is formed by selective exposure and development processing to a new photoresist layer in a similar manner to that in a conventional case and is provided with a recess 56a having a flat surface shape of the probe tip portion 24b. From this recess 56a, a surface of the base table 50 and a part of the sacrifice layer 42 are exposed.

Figure 7C:
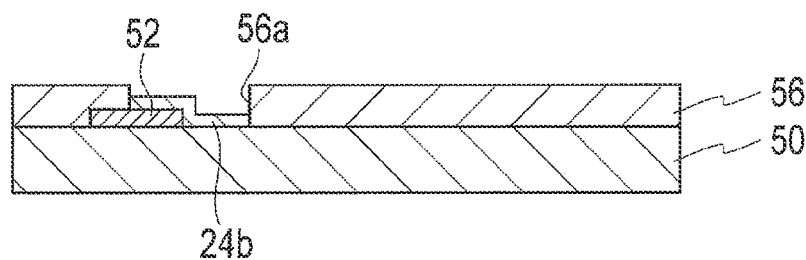

On the surface part of the base table 50 and the sacrifice layer 52 exposed from the recess 56a of the second photolithographic mask 56, the second metal material is deposited to have an approximately equal thickness to a thickness of the sacrifice layer 52 by an electroplating method as illustrated in FIG. 7C. By this deposition of the second metal material, the probe tip portion 24b is formed.

Figure 7D:
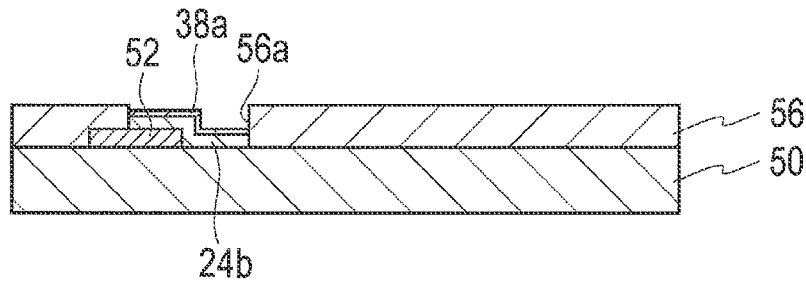
Figure 7E:
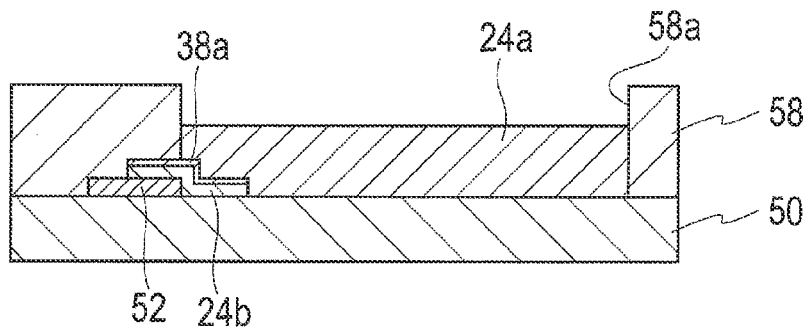

After formation of the probe tip portion 24b, the first metal material is further deposited on the probe tip portion 24b in the recess 56a as illustrated in FIG. 7D, and the metal layer 38a is formed by this deposition of the first metal material.

When the photolithographic mask 56 is removed from the base table 50, a new third photolithographic mask 58 is further formed on the base table 50. This photolithographic mask 58 is formed by similar selective exposure and development processing to a new photoresist layer to the aforementioned ones. By doing so, the photolithographic mask 58 is provided with a recess 58a having a flat surface shape of the probe main body portion 24a. On the metal layer 38a and the base table 50 exposed from the recess 58a, an equal metal material to the metal layer 38a is deposited, thus to form the probe main body portion 24a (refer to FIG. 7E).

After formation of the probe main body portion 24a, the third photolithographic mask 58 is removed, the sacrifice layer 52 is removed, and the probe 24 is thereafter separated from the base table 50. Thus, the probe 24 illustrated in FIG. 4 having a larger allowable current value than that of the conventional probe (characteristic line C) made of combination of foreign metal materials can be obtained.

Figure 8A:
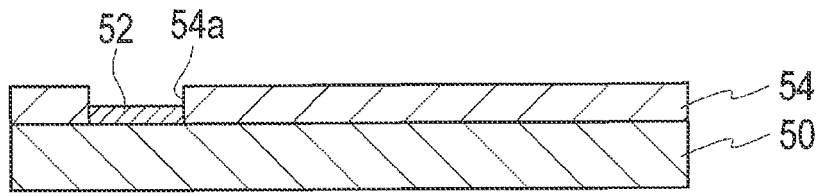
FIGS. 8A to 8D are process diagrams (No. 1) illustrating a process for manufacturing the probe according to the embodiment illustrated in FIGS. 3 and 5.

Next, a method for manufacturing the probe 24 illustrated in FIG. 5 will be described based on FIGS. 8A to 9H. As illustrated in FIG. 8A, on the base table 50, the sacrifice layer 52 is formed in the recess 54a with use of the similar first photolithographic mask 54 to that illustrated in FIG. 7A.

Figure 8B:
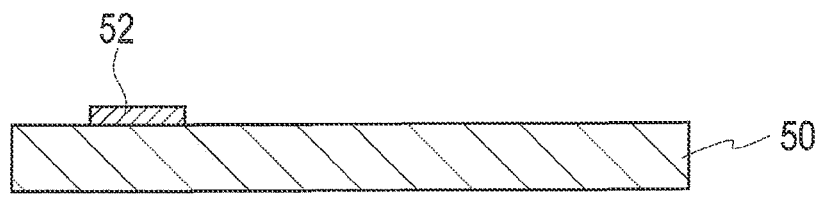
Figure 8C:
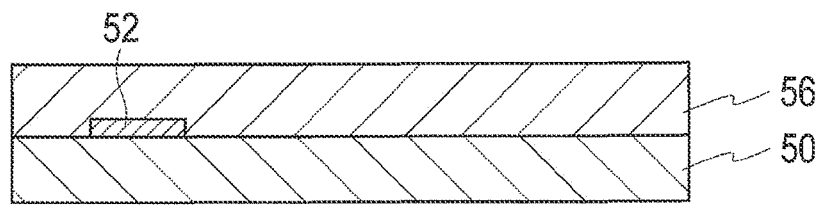

After formation of the sacrifice layer 52, the photolithographic mask 54 is removed as illustrated in FIG. 8B, and the photoresist layer 56 is thereafter formed to cover the base table 50 and the sacrifice layer 52 as illustrated in FIG. 8C.

Figure 8D:
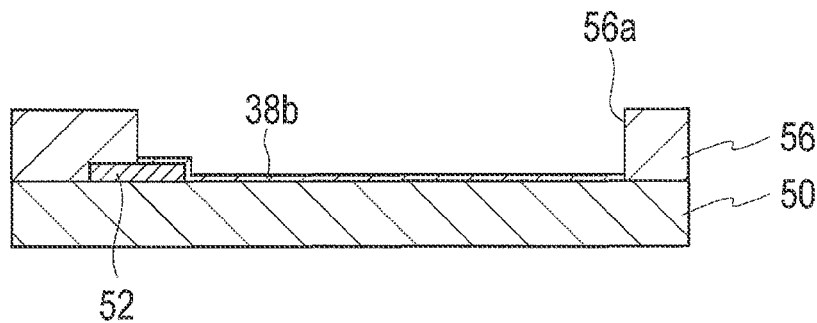

The photoresist layer 56 is subjected to similar selective exposure and development processing to the aforementioned ones, thus to form the second photolithographic mask 56 having the recess 56a as illustrated in FIG. 8D. The recess 56a of the photolithographic mask 56 has a flat surface shape of the probe main body portion 24a and exposes parts of surfaces of the sacrifice layer 52 and the base table 50. On the surfaces of the sacrifice layer 52 and the base table 50 exposed from this recess 56a is deposited the first metal material. By this deposition of the first metal material, the metal layer 38b having a flat surface shape of the probe main body portion 24a is formed.

Figure 9E:
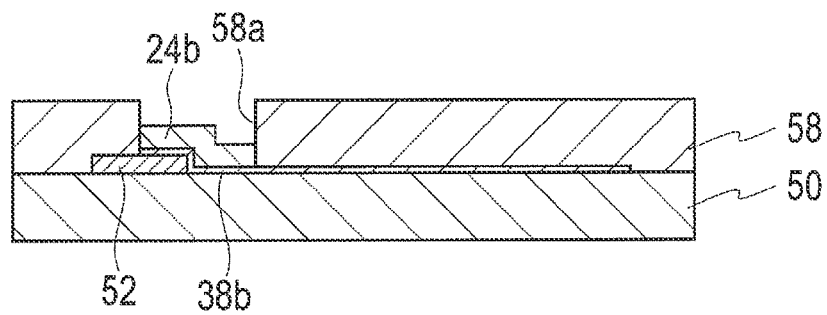
FIGS. 9E to 9H are process diagrams (No. 2) illustrating the process for manufacturing the probe according to the embodiment illustrated in FIGS. 3 and 5.

After formation of the metal layer 38b, the second photolithographic mask 56 is removed. After removal of the photolithographic mask 56, the third photolithographic mask 58 having the recess 58a that exposes a part of the metal layer 38b is formed on the surface of the base table 50 as illustrated in FIG. 9E. The photolithographic mask 58 is formed by similar selective exposure and development processing to the aforementioned ones. The recess 58a of the photolithographic mask 58 has a flat surface shape of the probe tip portion 24b. Thus, by depositing the second metal material on a part of this metal layer 38b exposed from the recess 58a, the probe tip portion 24b is formed.

Figure 9F:
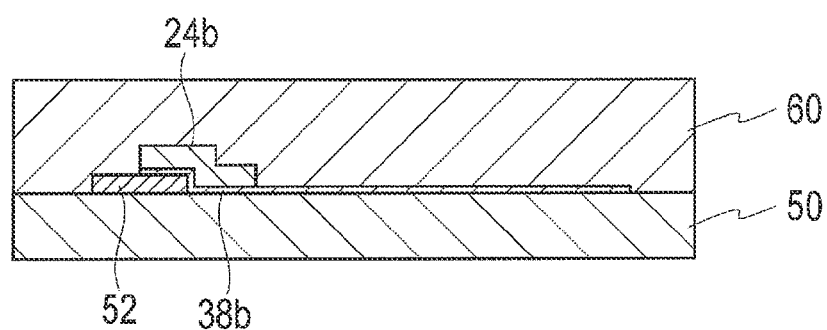
Figure 9G:
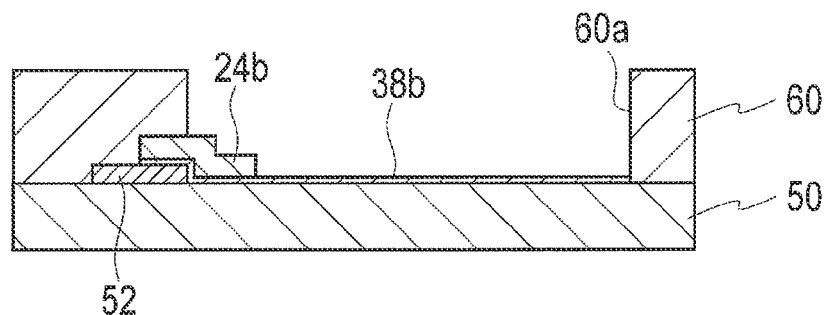
Figure 9H:
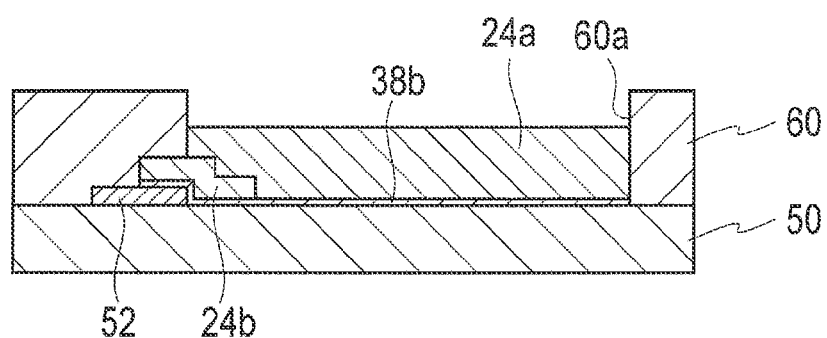

After formation of the probe tip portion 24b, the photolithographic mask 58 is removed, and the base table 50 is covered with another new photoresist layer 60 as illustrated in FIG. 9F. The photoresist layer 60 is subjected to similar selective exposure and development processing to the aforementioned ones. By doing so, as illustrated in FIG. 9G, the fourth photolithographic mask 60 having a recess 60a that exposes parts of the probe tip portion 24b and the metal layer 38b is formed on the base table 50. The recess 60a has a flat surface shape of the probe main body portion 24a in a similar manner to the recess 56a illustrated in FIG. 8D. Thus, by depositing the first metal material on a part of the probe tip portion 24b exposed from the recess 60a and the metal layer 38b, the probe main body portion 24a is formed (refer to FIG. 9H).

After formation of the probe main body portion 24a, the fourth photolithographic mask 60 is removed, the sacrifice layer 52 is removed, and the probe 24 is thereafter separated from the base table 50. Thus, the probe 24 illustrated in FIG. 5 having a larger allowable current value than that of the conventional probe (characteristic line C) made of combination of foreign metal materials can be obtained.

An example in which the metal layer 38a is formed to cover an entire surface of one side surface of the probe tip portion 24b in relation to FIG. 4 and an example in which the metal layer 38b is formed to cover an entire surface of one side surface of the probe main body portion 24a in relation to FIG. 5 have been described, respectively. Alternatively, the metal layer 38a can be formed to extend in a strip shape on the side surface of the probe tip portion 24b without covering the entire surface of the surface and reach the probe tip. Also, the metal layer 38b can be formed to extend in a strip shape on the side surface of the probe main body portion 24a without covering the entire surface of the surface and reach the upper end 30a.

Also, the metal layers 38a and 38b can be formed in the probe tip portion 24b and the probe main body portion 24a, not on the side surfaces of the probe tip portion 24b and the probe main body portion 24a. However, for simplification of manufacture, the metal layers 38a and 38b are preferably formed on the side surfaces of the probe tip portion 24b and the probe main body portion 24a as illustrated in the figures.

Further, as for the probe tip portion 24b, a linear probe tip portion can be adopted instead of the crank-like portion.

Figure 10:
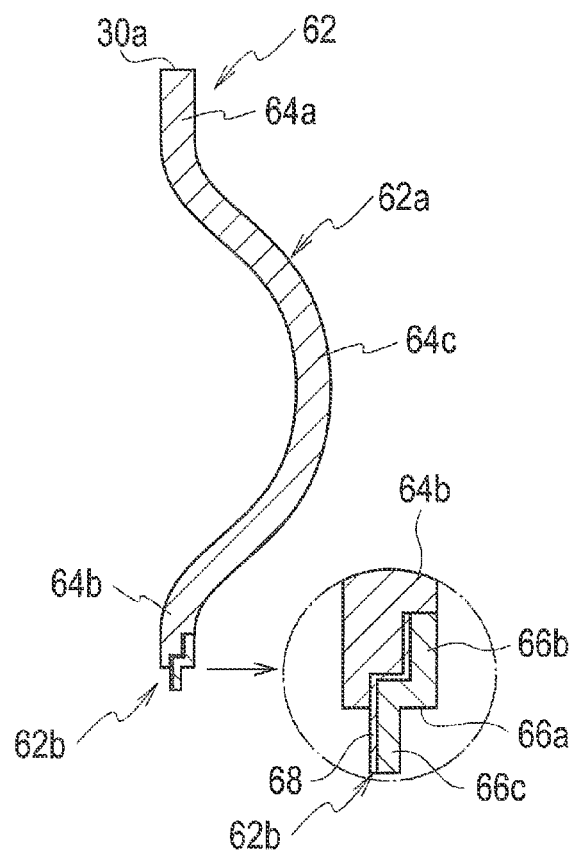
FIG. 10 is a vertical cross-sectional view illustrating still another example of the probe according to the embodiment.

FIG. 10 illustrates an example in which the subject matter has been applied to a vertical probe of a vertical operation type electrical connecting apparatus (probe card) disclosed in Japanese National Utility Model Appln. Public Disclosure No. H07-29838. In the example illustrated in FIG. 10, a vertical probe 62 includes a probe main body portion 62a having a pair of linear portions 64a and 64b arranged coaxially with each other and arranged to be away from each other and a curved deformed portion 64c residing between both the linear portions and connecting ends of the linear portions opposed to each other. The other end of one linear portion 64a is the upper end 30a of the vertical probe 62 as a connection end to a circuit of a probe base plate. The other end of the other linear portion 64b is provided with a similar probe tip portion 62b to the aforementioned one.

As is conventionally well known, in the vertical probe 62, when a probe tip is thrust by the electrode 12a of the device under test 12, the curved deformed portion 64c is elastically deformed between the pair of linear portions 64a and 64b to obtain predetermined probe pressure.

The probe main body portion 62a is made of the aforementioned first metal material such as nickel boron. The probe tip portion 62b is made of the aforementioned second metal material such as rhodium.

As enlarged and illustrated in a circle in FIG. 10, the probe tip portion 62b is formed in a similar crank shape to that of the probe tip portion 24b, and one end portion 66c out of end portions 66b and 66c communicating with each other via a middle portion 66a is protruded from the other end of the other linear portion 64b while the other end portion 66b is buried in the other linear portion 64b.

At an interface between the probe main body portion 62a and the probe tip portion 62b or an interface between the other linear portion 64b and the probe tip portion 62b, a metal layer 68 made of nickel boron as the first metal material is formed in a similar manner to that in the example illustrated in FIG. 4. The metal layer 68 goes over an interface between the linear portion 64b of the probe main body portion 62a and the other end portion 66c of the probe tip portion 62b and reaches a tip end of the end portion 66c or the probe tip.

Accordingly, in the vertical probe 62, the metal layer 68 forms a current bypass path made of the equal metal material on an electrical path having a boundary by a junction of foreign metal materials formed by the probe tip portion 62b and the probe main body portion 62a combined with the probe tip portion, together with the probe main body portion 62a, in a similar manner to the example illustrated in FIG. 4.

Figure 11:
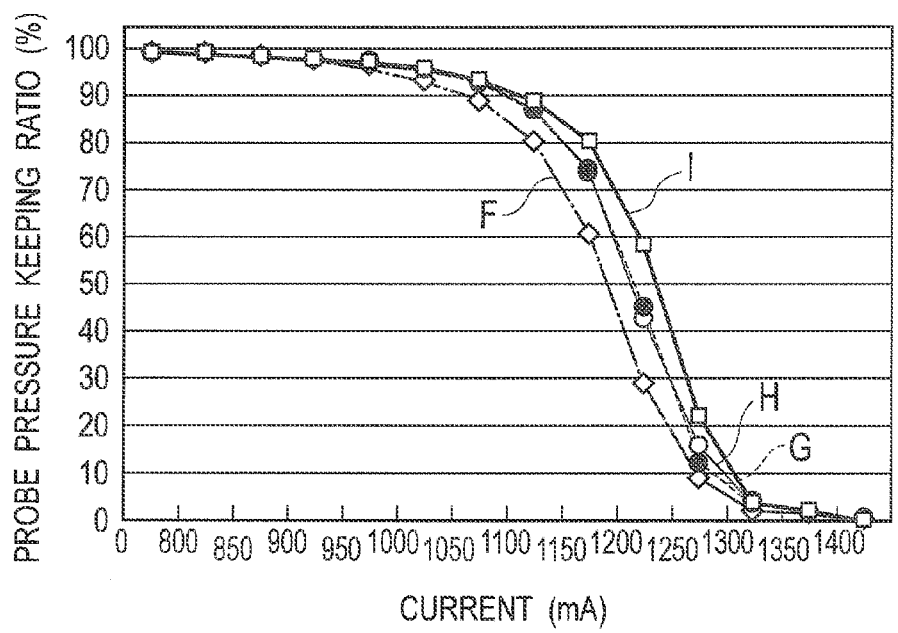
FIG. 11 is a graph similar to FIG. 1 illustrating characteristic changes when a thickness of a bypass layer of the probe illustrated in FIG. 10 is changed.

FIG. 11 is a graph similar to FIG. 1 illustrating comparison between the vertical probes 62 according to the embodiment and a conventional vertical probe that does not have the metal layer 68. A characteristic line F represents a characteristic of the conventional vertical probe. Characteristic lines G to I represent characteristics of the vertical probes 62 when thicknesses of the metal layers 68 are different. The characteristic line G represents a characteristic of the vertical probe 62 in which the thickness of the metal layer 68 is 1 µm, and in which the thickness of the probe tip portion 62b made of rhodium along this thickness direction is 11.5 µm. The characteristic lines H and I represent characteristics of the vertical probes 62 in which the thicknesses of the metal layers 68 are 2 µm and 3 µm, and in which the thicknesses of the probe tip portions 62b are 10.5 µm and 9.5 µm, respectively.

According to the graph in FIG. 11, an allowable current value of 1045 mA was obtained for the characteristic line F of the conventional vertical probe. On the other hand, allowable current values of 1074 mA, 1094 mA, and 1078 mA were obtained for the characteristic lines G, H, and I of the vertical probes 62 according to the embodiment.

As is apparent from the comparison among these allowable current values, with the probe 62 according to the embodiment, the allowable current value was able to be larger at least by about 30 mA or more than the allowable current value for the conventional vertical probe, regardless of the difference in thickness of the metal layer 68.

In the foregoing description, an example in which each of the metal layers 38 (38*a* and 38*b*) and 68 is made of the first or second metal material has been described. Alternatively, each of the metal layers can be made of a different metal material from the first and second metal materials. In this case, each of the metal layers is formed at least in a strip shape so as to extend from the upper end 30*a* of the probe main body portion 24*a* or 62*a* to the tip end of the probe tip portion 24*b* or 62*b*. Also, in a case where each of the metal layers is made of a different metal material from the first and second metal materials, adopting a metal material having lower resistivity (volume resistivity: Ω cm) than those of the first and second metal materials for the metal layer is advantageous to low resistance of the probe and an increase of the allowable current value.

The described subject matter is not limited to the above embodiments but may be altered in various ways without departing from the spirit and scope presented here.

What is claimed is:

1. An electrical test probe comprising:
   a probe main body portion made of a first metal material with resiliency and having a connection end and an opposite end, wherein the connection end is configured to connect to a circuit of a probe base plate;
   a probe tip portion made of a second metal material with a higher hardness and a lower electrical resistivity (Ω cm) than that of the first metal material, wherein the probe tip portion has a probe tip and a base, wherein the base is in contact with the opposite end of the probe main body portion; and
   a metal layer on the probe main body portion and extending from the connection end to the opposite end, wherein the metal layer consists of the second metal material.

2. The electrical test probe according to claim 1, wherein the first metal material is nickel or a nickel alloy, and the second metal material is rhodium.

3. The electrical test probe according to claim 1, wherein the probe tip portion and the metal layer on the probe main body portion define a current path from the probe tip to the connection end, and the current path does not have an interface formed by a junction of different metals.

4. The electrical test probe according to claim 1, wherein the electrical test probe is a cantilever-type probe in which the probe main body portion includes:
   an attaching portion forming the connection end and extending in a first direction away from the connection end;
   an arm portion connected to the attaching portion and extending to an arm end in a second direction approximately perpendicularly to the first direction; and
   a pedestal portion connected to the arm end and extending away from the arm end in the first direction to the opposite end.

5. The electrical test probe according to claim 4, wherein the arm portion is provided with a slot adapted to facilitate elastic deformation of the arm portion.

6. The electrical test probe of claim 4, wherein the probe tip portion extends away from the opposite end of the probe main body portion in the first direction.

7. The electrical test probe of claim 4, wherein:
   the probe tip portion and the metal layer on the probe main body portion define a current path from the probe tip to the connection end;
   the current path does not have an interface formed by a junction of different metals; and
   the current path extends in the first direction from the connection end, in the second direction to the arm end, and in the first direction from the arm end to the probe tip.

8. The electrical test probe of claim 7, wherein the connection end has a flat surface perpendicular to the first direction.

9. An electrical test probe comprising:
   a probe body portion made of a first metal material with resiliency and having a proximal end and an opposite end, wherein the proximal end is configured to connect to a circuit of a probe base plate;
   a tip portion made of a second metal material with a higher hardness and a lower electrical resistivity (Ω cm) than that of the first metal material, wherein the tip portion has a distal tip and a base, wherein the base is in contact with the opposite end of the probe body portion; and
   a metal layer on the probe body portion and on the tip portion, and extending from the proximal end of the probe body portion to the distal tip of the tip portion, wherein the metal layer consists of the second metal material.

10. The electrical test probe according to claim 9, wherein the first metal material is nickel or a nickel alloy, and the second metal material is rhodium.

11. The electrical test probe according to claim 9, wherein the electrical test probe is a cantilever-type probe in which the probe body portion includes:
    an attaching portion forming the proximal end and extending in a first direction away from the proximal end;
    an arm portion connected to the attaching portion and extending to an arm end in a second direction approximately perpendicularly to the first direction; and
    a pedestal portion connected to the arm end and extending away from the arm end in the first direction to the opposite end.

12. An electrical test probe comprising:
    a probe body portion made of a first metal material with resiliency and having a proximal end and an opposite end, wherein the proximal end is configured to connect to a circuit of a probe base plate;
    a tip portion made of a second metal material with a higher hardness and a lower electrical resistivity (Ω cm) than that of the first metal material, wherein the tip portion has a distal tip and a base, wherein the base is in contact with the opposite end of the probe body portion; and
    a metal layer on the probe body portion and on the tip portion, and extending from the proximal end of the probe body portion to the distal tip of the tip portion, wherein the metal layer consists of the first metal material.

13. The electrical test probe according to claim 12, wherein the first metal material is nickel or a nickel alloy, and the second metal material is rhodium.

14. The electrical test probe according to claim 12, wherein the electrical test probe is a cantilever-type probe in which the probe body portion includes:
- an attaching portion forming the proximal end and extending in a first direction away from the proximal end;
- an arm portion connected to the attaching portion and extending to an arm end in a second direction approximately perpendicularly to the first direction; and
- a pedestal portion connected to the arm end and extending away from the arm end in the first direction to the opposite end.

* * * * *